US011136169B2

(12) United States Patent
Chatterton et al.

(10) Patent No.: US 11,136,169 B2
(45) Date of Patent: Oct. 5, 2021

(54) TAMPER-RESISTANT CHEMICAL REAGENT PACKAGE

(71) Applicant: ENTEGRIS, Inc., Billerica, MA (US)

(72) Inventors: Thomas B. Chatterton, Round Rock, TX (US); Jacob Thomas, Leander, TX (US)

(73) Assignee: Entegris, Inc., Billerica, MA (US)

( * ) Notice: Subject to any disclaimer, the term of this patent is extended or adjusted under 35 U.S.C. 154(b) by 246 days.

(21) Appl. No.: 16/091,845

(22) PCT Filed: Apr. 10, 2017

(86) PCT No.: PCT/US2017/026816
§ 371 (c)(1),
(2) Date: Oct. 5, 2018

(87) PCT Pub. No.: WO2017/184368
PCT Pub. Date: Oct. 26, 2017

(65) Prior Publication Data
US 2019/0084733 A1 Mar. 21, 2019

Related U.S. Application Data

(60) Provisional application No. 62/324,342, filed on Apr. 19, 2016.

(51) Int. Cl.
*B65D 45/16* (2006.01)
*B65D 50/00* (2006.01)
(Continued)

(52) U.S. Cl.
CPC ............. *B65D 45/16* (2013.01); *B65D 45/02* (2013.01); *B65D 50/00* (2013.01); *B65D 53/02* (2013.01); *B65D 55/02* (2013.01); *C23C 16/4481* (2013.01)

(58) Field of Classification Search
CPC ........ B65D 45/16; B65D 45/02; B65D 53/02; B65D 50/00; B65D 55/02; C23C 16/4481
See application file for complete search history.

(56) References Cited

U.S. PATENT DOCUMENTS 5,697,743 A 12/1997 Parker
8,689,996 B2 * 4/2014 Ting ....................... B65D 39/08
220/315

(Continued)

FOREIGN PATENT DOCUMENTS

CN 1116442 A 2/1996
CN 1352734 A 6/2002
(Continued)

*Primary Examiner* — Shawntina T Fuqua

(57) ABSTRACT

A tamper-resistant containment package is described, including a container; a cover configured to engage with the container so that the container and cover form an enclosed volume; and at least one tamper-resistant mechanical fastener that is cooperative with the cover and container to render the containment package tamper-resistant when the container and cover are engaged in a sealed state isolating the enclosed volume from an ambient environment surrounding the containment package. Such containment package is usefully employed for storage and transport of chemical reagents that pose a health, safety, and/or environmental risk if released to an exterior environment of the containment package.

15 Claims, 6 Drawing Sheets

(51) Int. Cl.
      *B65D 55/02*       (2006.01)
      *B65D 45/02*       (2006.01)
      *C23C 16/448*     (2006.01)
      *B65D 53/02*       (2006.01)

(56) References Cited

U.S. PATENT DOCUMENTS

| | | |
|---|---|---|
| 2007/0079759 A1 | 4/2007 | Lee |
| 2011/0214461 A1* | 9/2011 | Camisasca ............. F16B 41/00<br>70/232 |
| 2012/0267494 A1* | 10/2012 | Manahan ............... B65D 45/02<br>248/226.11 |

FOREIGN PATENT DOCUMENTS

| | | |
|---|---|---|
| CN | 104791359 A | 7/2015 |
| FR | 1433822 A | 4/1966 |
| JP | 07145808 A | 6/1995 |
| TW | 200405484 A | 4/2004 |
| WO | 2004010463 A2 | 1/2004 |

\* cited by examiner

TAMPER-RESISTANT CHEMICAL REAGENT PACKAGE

RELATED APPLICATIONS

This application is filed under the provisions of 35 U.S.C. § 371 claiming priority to International Patent Application No. PCT/US2017/026816 filed on Apr. 10, 2017, which further claims the benefit of priority under 35 U.S. C. § 119 of U.S. Provisional Patent Application No. 62/324,342, filed 19 Apr. 2016. The disclosure of U.S. Provisional Patent Application No. 62/324,342 is incorporated herein by reference, in its entirety, for all purposes.

FIELD

The present disclosure generally relates to packages for containment of materials, articles, assemblies, etc. that are desirably protected from exposure to an ambient environment of the package, e.g., chemical reagent packages that are used to contain chemical reagents, especially those of a toxic or otherwise hazardous character that may pose health, safety, or environmental risks if released to a local environment of the package. More specifically, the disclosure relates to packages having tamper-resistant safety features to protect against undesired exposure of the contents of the package to the ambient environment of the package or the ambient environment surrounding the package.

DESCRIPTION OF THE RELATED ART

In the transport, storage, installation, and use of solid and liquid chemical reagents, a wide variety of packages have been developed for containment of the chemical reagent. Many of such chemical reagents pose health, safety, and environmental risks if the chemical reagent package is breached and the contained chemical reagent is exposed and released to the local environment of the package.

For example, in the semiconductor manufacturing industry, a wide variety of chemical hydrides, acids, and organo-metallic reagents are utilized in the manufacture of integrated circuitry and microelectronic products. Many of such reagents have extremely low threshold limit values (TLVs), which are levels of chemical substances to which workers can be exposed on a day after day basis without adverse health effects. The same is true for many solid and liquid reagents used in the manufacture of flat-panel displays and solar panels. In addition to health and safety considerations relating to breaching of the chemical reagent packages containing such reagents, there is the accompanying disadvantage that the purity of the chemical reagent, which in many cases is required to be of high purity or even ultra-high purity, may be compromised if the reagent is exposed to the ambient environment of the container and degraded by the ambient environmental disclosure so that it becomes deficient or even useless for its intended purpose.

Accordingly, the art continues to seek chemical reagent package designs having an enhanced safety character, to assist in preventing unwanted release of chemical reagent from the package to an ambient environment of the package, and to safeguard the chemical reagent from exposure to such ambient environment.

SUMMARY

The present disclosure relates to packages in which a container and cover are mechanically fastened to one another, and in which the contents of the package are desirably protected from exposure to an exterior environment of the package.

In one aspect, the disclosure relates to a tamper-resistant containment package, comprising: a container; a cover configured to engage with the container so that the container and cover form an enclosed volume; and at least one tamper-resistant mechanical fastener that is cooperative with the cover and container to render the containment package tamper-resistant when the container and cover are engaged in a sealed state isolating the enclosed volume from an ambient environment of the containment package or an ambient environment surrounding the containment package.

In another aspect, the present disclosure relates to a tamper-resistant containment package, comprising: a container; a cover configured to engage with a portion of the container so that the container and cover form an enclosed volume; an array of mechanical fasteners configured to interconnect the cover with the portion of the container engaging the cover, such array comprising: a first sub-array of said mechanical fasteners, comprising seal mechanical fasteners that aggregately seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of said mechanical fasteners, do not seal the engaged container and cover, and (ii) by their tamper-resistant character prevent the cover from being disengaged from the container except by tampering removal thereof from the engaged container and cover.

In yet another aspect, the disclosure relates to a tamper-resistant package comprising: a container; a cover configured to engage with a portion of the chemical reagent container so that the container and cover form an enclosed volume; at least one seal element intermediate the engaged container and cover; and an array of mechanical fasteners configured to interconnect the cover with the portion of the container engaging the cover, such array comprising: a first sub-array of the mechanical fasteners, comprising seal mechanical fasteners that aggregately with the at least one seal element leak-tightly seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of the mechanical fasteners, do not leak-tightly seal the engaged container and cover, and (ii) by their tamper-resistant character prevent the cover from being disengaged from the container except by tampering removal thereof from the engaged container and cover.

In still yet another aspect the disclosure relates to a tamper-resistant containment package, comprising: a container; a cover configured to engage with a portion of the container so that the container and cover form an enclosed volume; an array of mechanical fasteners configured to interconnect the cover with the portion of the container engaging the cover, the array comprising: a first sub-array of said mechanical fasteners, comprising seal mechanical fasteners that aggregately seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of said mechanical fasteners, do not seal the engaged container and cover, and (ii) by their tamper-resistant character prevent the cover from being disengaged from the container except by tampering removal thereof from the engaged container and cover. The tamper-resistant containment package can in some embodiments have a second sub-array of said mechanical fasteners that comprises tamper-resistant mechanical fasteners that are at least one of: (i) smaller in size than the seal mechanical fasteners of the first sub-array of said mechanical fasteners; (ii) non-removable by mechanical fastener tools adapted for removal of the seal mechanical fasteners; (iii) countersunk in the cover below a surface above which the seal mechanical fasteners of the first sub-array of the mechanical fasteners protrude; and (iv) characterized by a lock torque that is from 10 to 60% of lock torque of the seal mechanical fasteners of the first sub-array of said mechanical fasteners. In some embodiments of this tamper-resistant containment package at least two of features (i)-(iv) are present in the package. The tamper-resistant containment package can further comprise at least one seal element intermediate the engaged container and cover and wherein the portion of the container engaging the cover can optionally comprise an outwardly extending flange presenting an engagement surface for a peripheral portion of the cover. The tamper-resistant containment package can contain a liquid chemical reagent material in the enclosed volume or a solid chemical reagent material that can be in a particulate or crusted form that is contained in the enclosed volume of the package. The tamper-resistant containment package container is configured to be heated to transmit thermal energy to the material in the enclosed volume to generate a vapor of the material. The tamper-resistant containment package can further include at least one support structure, a tray in the enclosed volume, or an array of trays in the enclosed volume for holding the liquid or solid chemical reagent material. In embodiments of the tamper-resistant containment package, the second sub-array of the mechanical fasteners can comprise tamper-resistant mechanical fasteners that are non-removable by mechanical fastener tools adapted for removal of the seal mechanical fasteners and optionally the second sub-array of said mechanical fasteners comprises tamper-resistant mechanical fasteners that are characterized by a lock torque that is from 10 to 60% of lock torque of the seal mechanical fasteners of the first sub-array of said mechanical fasteners.

In a still further aspect, the disclosure relates to a tamper-resistant containment package, comprising: a container; a cover configured to engage with the container so that the container and cover form an enclosed volume; and at least one tamper-resistant mechanical fastener that is cooperative with the cover and container to render the containment package tamper-resistant when the container and cover are engaged in a sealed state isolating the enclosed volume from an ambient environment of the containment package. The tamper-resistant containment package can in some embodiments comprise an array of the tamper-resistant mechanical fasteners, and in further embodiments at least one tamper-resistant mechanical fastener can be effective to maintain the container and cover in the sealed state. In some embodiments of the tamper resistant containment package, the at least one tamper-resistant mechanical fastener can engage a sealing bracket so that the sealing bracket exerts compression on the container and cover for sealing of the container and cover in a sealed state isolating the enclosed volume of the container from an ambient environment. In some embodiments at least one tamper-resistant mechanical fastener threadably engages the cover and container.

In other aspects the disclosure relates to a tamper-resistant package that comprises or includes a container and a cover configured to engage with a portion of the chemical reagent container so that the container and cover form an enclosed volume. The tamper-resistant package includes at least one seal element intermediate the engaged container and cover; an array of mechanical fasteners configured to interconnect the cover with the portion of the container engaging the cover, the array comprising: a first sub-array of the mechanical fasteners, comprising seal mechanical fasteners that aggregately with the at least one seal element leak-tightly seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of the mechanical fasteners, do not leak-tightly seal the engaged container and cover, and (ii) by their tamper-resistant character prevent the cover from being disengaged from the container except by tampering removal thereof from the engaged container and cover. The tamper-resistant package can have a cover that has a generally planar exterior face, and the tamper-resistant mechanical fasteners can be counter-sunk in the planar exterior face of the cover to enhance tamper-resistance thereof. The tamper-resistant mechanical fasteners for the tamper-resistant package can have a lock torque that is from 10% to 60% of lock torque of the seal mechanical fasteners. The container engaging the cover of the tamper resistant package can comprise an outwardly extending flange presenting an engagement surface for a peripheral portion of the cover.

In a further aspect, the disclosure relates to a kit, comprising a tamper-resistant package in accordance with the present disclosure, as variously described herein, and a tamper-resistant mechanical fastener removal tool that is specially adapted to non-tamperingly remove the tamper-resistant mechanical fasteners from the cover and container, and that is ineffective to remove the seal mechanical fasteners from the cover and container.

Other aspects, features and embodiments of the disclosure will be more fully apparent from the ensuing description and appended claims.

DETAILED DESCRIPTION

Figure 1:
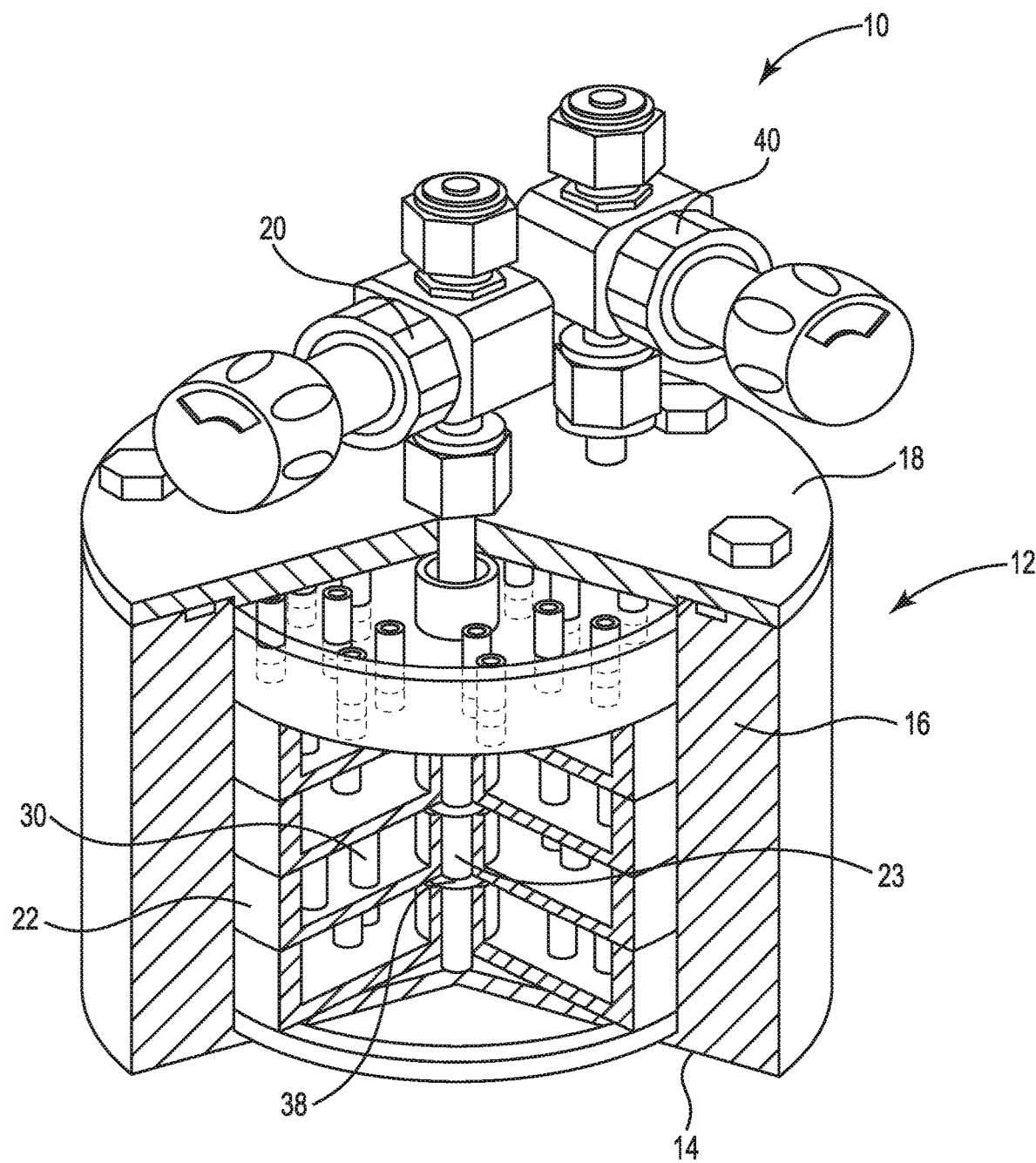
FIG. 1 (PRIOR ART) is a perspective view of a chemical reagent package of a type to which the tamper-resistant features of the present disclosure may be usefully applied.

The present disclosure relates to packages that incorporate tamper-resistant safety features that protect the contents of the package from exposure to an ambient environment of the package.

In one aspect, the present disclosure relates to a tamper-resistant containment package, comprising: a container; a cover configured to engage with the container so that the container and cover form an enclosed volume; and at least one tamper-resistant mechanical fastener that is cooperative with the cover and container to render the containment package tamper-resistant when the container and cover are engaged in a sealed state isolating the enclosed volume from an ambient environment of the containment package.

In various embodiments of such tamper-resistant containment package, an array of the tamper-resistant mechanical fasteners may be employed. In various embodiments, the tamper-resistant mechanical fasteners threadably engage the cover and container. The tamper-resistant mechanical fasteners in various embodiments may be of a form in which the tamper-resistant mechanical fasteners are effective to maintain the container and cover in the sealed state.

In various embodiments, the tamper-resistant containment package may be constituted with each of the at least one tamper-resistant mechanical fasteners engaging a sealing bracket so that the sealing bracket exerts compression on the container and cover for sealing of the container and cover in the sealed state in which the enclosed volume of the package is isolated from an ambient environment of the containment package.

Thus, in various embodiments, the tamper-resistant mechanical fastener can serve a dual purpose, serving to impart tamper-resistant character to the package comprising the container and cover, as well as being effective to seal, or assist in sealing, the container and cover, so that they are in a sealed state isolating the enclosed volume of the package from an ambient environment of the package.

The tamper-resistant mechanical fasteners utilized in packages of the present disclosure are configured to be effective to prevent the cover from being disengaged from the container except by tampering removal of the cover from the engaged cover and container assembly, e.g., subsequent to the time at which the package is loaded with the chemical reagent and sealed, and prior to reloading, reconditioning, or other ultimate disposition of the package.

In various embodiments, the present disclosure relates to a tamper-resistant containment package, comprising: a container; a cover configured to engage with a portion of the container so that the container and cover form an enclosed volume; an array of mechanical fasteners configured to interconnect the cover with the portion of the container engaging the cover, such array comprising: a first sub-array of said mechanical fasteners, comprising seal mechanical fasteners that aggregately seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of said mechanical fasteners, do not seal the engaged container and cover, and (ii) by their tamper-resistant character prevent the cover from being disengaged from the container except by tampering removal thereof from the engaged container and cover.

In other embodiments, the disclosure relates to a tamper-resistant package comprising: a container; a cover configured to engage with a portion of the chemical reagent container so that the container and cover form an enclosed volume; at least one seal element intermediate the engaged container and cover; and an array of mechanical fasteners configured to interconnect the cover with the portion of the container engaging the cover, such array comprising: a first sub-array of the mechanical fasteners, comprising seal mechanical fasteners that aggregately with the at least one seal element leak-tightly seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of the mechanical fasteners, do not leak-tightly seal the engaged container and cover, and (ii) by their tamper-resistant character prevent the cover from being disengaged from the container except by tampering removal thereof from the engaged container and cover.

In various embodiments of the above-described tamper-resistant containment package, the second sub-array of the mechanical fasteners may comprise tamper-resistant mechanical fasteners that are at least one of: (i) smaller in size than the seal mechanical fasteners of the first sub-array of said mechanical fasteners; (ii) non-removable by mechanical fastener tools adapted for removal of the seal mechanical fasteners; (iii) countersunk in the cover below a surface above which the seal mechanical fasteners of the first sub-array of the mechanical fasteners protrude; and (iv) characterized by a lock torque that is from 10 to 60% of lock torque of the seal mechanical fasteners of the first sub-array of the mechanical fasteners.

The tamper-resistant containment package described above may be constituted in various embodiments so that the seal mechanical fasteners of the first sub-array of the mechanical fasteners leak-tightly seal the engaged container and cover, and so that the mechanical fasteners of the second sub-array of the mechanical fasteners aggregately in the absence of the first sub-array of the mechanical fasteners, do not leak-tightly seal the engaged container and cover.

The tamper-resistant containment package described above may in particular embodiments further comprise at least one seal element intermediate the engaged container and cover, e.g., a gasket, e.g., a metal gasket, a circular ring of elastomeric material, or other sealing element or elements.

The tamper-resistant containment package may in various embodiments be constructed with the portion of the container engaging the cover comprising an outwardly extending flange presenting an engagement surface for a peripheral portion of the cover.

The tamper-resistant containment package of the present disclosure may be formed of any suitable material or materials of construction. For example, the container and the cover may be formed of metal, with the container and cover being formed of a same metal, or alternatively of different metals. In various embodiments, the container and cover are formed of stainless steel.

In the use of the tamper-resistant containment package, one or more phases of the chemical reagent source material may be contained in the enclosed volume of the package. In various embodiments, the chemical reagent source material may comprise a solid material contained in the enclosed volume, such as a solid material having a vapor pressure that generates a vapor of the solid material in the enclosed volume. In other embodiments, the source material may comprise a liquid with significant vapor pressure, so that liquid and vapor of the chemical reagent are present in the package.

In some embodiments, the package may be constructed and arranged for use as a vaporizer package, in which the container is configured to be heated to transmit thermal energy to a solid chemical reagent material that is contained in the enclosed volume. In such embodiments, the tamper-resistant containment package may be provided in combination with a heater adapted to transmit thermal energy to the solid material in the enclosed volume of the package, so that the solid chemical reagent can be volatilized by heating of the container, to generate vapor for dispensing from the package.

In general, the tamper-resistant containment package may contain in the enclosed volume any suitable chemical reagent material, such as a chemical reagent for manufacture of semiconductor products, flat-panel displays, or solar panels. The solid chemical reagent in the package may be in any suitable form, e.g., in a particulate, granular, powder, or other discontinuous form, or alternatively in the form of a monolith such as block, brick, or boule forms, or alternatively in a crusted layer form, in which the crusted layer comprises a fused crust of the solid chemical reagent that overlies the solid chemical reagent in a particulate form.

The tamper-resistant containment package in various embodiments contains at least one support structure in the interior volume, providing support surface for retention of a solid chemical reagent thereon. The support structure may be of any suitable type. For example, the support structure in the tamper-resistant containment package may comprise at least one tray that is mounted in the enclosed volume. In various embodiments, the support structure may comprise an array of trays in the enclosed volume, such as for example an array of trays of a type as shown in FIG. 1 herein.

In various embodiments, the tamper-resistant containment package may be fabricated with the second sub-array of the mechanical fasteners comprising tamper-resistant mechanical fasteners that are smaller in size than the seal mechanical fasteners of the first sub-array of the mechanical fasteners. In other embodiments, the second sub-array of the mechanical fasteners comprises tamper-resistant mechanical fasteners that are non-removable by mechanical fastener tools adapted for removal of the seal mechanical fasteners. In still other embodiments, the second sub-array of the mechanical fasteners comprises tamper-resistant mechanical fasteners that are countersunk in the cover below a surface above which the seal mechanical fasteners of the first sub-array of said mechanical fasteners protrude. In still other embodiments, the second sub-array of said mechanical fasteners comprises tamper-resistant mechanical fasteners that are characterized by a lock torque that is from 10 to 60% of lock torque of the seal mechanical fasteners of the first sub-array of said mechanical fasteners. In yet other embodiments, any of such preceding features of the tamper-resistant mechanical fasteners may be employed in various combinations of any two or more of such features, to provide a tamper-resistant package providing a desired character of tamper-resistance.

In a specific embodiment, the tamper-resistant package may comprise: a container; a cover configured to engage with a portion of the chemical reagent container so that the container and cover form an enclosed volume; at least one seal element intermediate the engaged container and cover; and an array of mechanical fasteners configured to interconnect the cover with the portion of the container engaging the cover, such array comprising: a first sub-array of the mechanical fasteners, comprising seal mechanical fasteners that aggregately with the at least one seal element leak-tightly seal the engaged container and cover; and a second sub-array of said mechanical fasteners, comprising tamper-resistant mechanical fasteners that interconnect the cover with the portion of the container engaging the cover, but which (i) aggregately in the absence of the first sub-array of the mechanical fasteners, do not leak-tightly seal the engaged container and cover, and (ii) by their tamper-resistant character prevent the cover from being disengaged from the container except by tampering removal thereof from the engaged container and cover.

Such specific embodiment may be constituted with the cover having a generally planar exterior face, with the tamper-resistant mechanical fasteners being counter-sunk in such face to enhance tamper-resistance thereof. Alternatively, or additionally, the tamper-resistant mechanical fasteners may have a lock torque that is from 10% to 60% of lock torque of the seal mechanical fasteners. The package in any of such embodiments previously described may be fabricated so that the portion of the container engaging the cover comprises an outwardly extending flange presenting an engagement surface for a peripheral portion of the cover.

The disclosure in another aspect relates to a kit, comprising a tamper-resistant package in accordance with the present disclosure, as variously described herein, and a tamper-resistant mechanical fastener removal tool that is specially adapted to non-tamperingly remove the tamper-resistant mechanical fasteners from the cover and container, and that is ineffective to remove the seal mechanical fasteners from the cover and container.

Referring now to the drawings, FIG. 1 (PRIOR ART) is a perspective view of a chemical reagent package of a type to which the tamper-resistant features of the present disclosure may be usefully applied.

Although the ensuing description is directed to a solid chemical reagent vaporizer package, it will be appreciated that such specific package is of an illustrative character only, and that the tamper-resistant features of the present disclosure may be generally applied to packages including a container to which a cover is joined by mechanical fasteners, to form an internal volume enclosed by the container and cover in which chemical reagent materials are contained, to isolate them from an exterior environment of the package in which such chemical reagent materials pose a risk that is increased in relation to their containment in the package.

The disclosure will therefore be set out with reference to an illustrative solid chemical reagent vaporizer package, in which a volatilizable solid chemical reagent can be heated by application of thermal energy to the container so that it is transmitted by the container to the solid chemical reagent to volatilize the reagent and form corresponding chemical reagent vapor, for dispensing to a vapor-utilizing facility, such as a semiconductor manufacturing facility, or a facility for manufacturing flat panel displays, solar panels, or other suitable products in which the chemical reagent vapor is utilized in the manufacturing process.

A vaporizer package of such type is illustrated in FIG. 1. The vaporizer package 10 comprises a container 12, fabricated of a suitable heat-conducting material, such as for example silver, silver alloy, copper, copper alloy, aluminum, aluminum alloy, lead, nickel clad, stainless steel, graphite, silicon carbide coated graphite, boron nitride, ceramic material, etc., or any of suitable combinations, mixtures and alloys of two or more of such types of material of construction.

The container comprises a floor 14 and circumscribing sidewall 16 that together form an interior volume of the container. The container can have any shape that facilitates an even flow of carrier gas through the interior volume thereof. In various embodiments, the container may have a cylindrical shape machined to very close tolerances (e.g., in a range of $1/1000^{th}$ to $3/1000^{th}$ of an inch).

The container includes a cover 18 on which is mounted a carrier gas inlet valve 20 arranged to selectively introduce carrier gas into the interior volume of the container, when the valve is open.

Positioned in the internal volume of the container is a plurality of vertically stacked trays 22. The stacked trays are separable from each other and removable from the container for easy cleaning and refilling. Positioned within the container is an internal carrier gas downtube 23 that is connected (e.g., welded) to a gas inlet in the cover associated with inlet valve 20 and conveys the carrier gas to the bottom of the internal volume below the lowest tray in the array of vertically stacked trays. In FIG. 1, the downtube 23 passes through a cylindrical collar 27 of each tray that extends through the floor 24 of the tray. It will be appreciated that to ensure a leak-proof seal at the juncture of the downtube with the floor 24 of the tray, a sealing O-ring 38 may be positioned between successive trays especially if the source material is a liquid. An additional outer O-ring can also be employed to seal between trays on the top surface of each tray sidewall.

When the chemical source reagent is in a solid form, various structural elements may be employed to suppress or minimize the entrainment of solids in the carrier gas flow. Such entrainment-combating features may be of any suitable type, and may for example include frit elements as well as particle suppression features or devices other than frits. The particle suppression features other than frits can in various embodiments include tortuous flow paths, upflow solids disengagement structures, tangential gas flow side streams serving a particle aggregation or collection function, etc. By way of specific example, high purity stainless steel frits, e.g., having a pore size in a range of from 1 to 100 microns, and at least one particle suppression feature other than a frit, could be added at any suitable location to control the carrier gas flow rate. Frits could for example be installed at the 'inlet' of each through-tube 30 associated with the trays, or a large disk frit could be added to the top tray and sealed therein by pressure from the installation of the lid on the container, or otherwise be disposed in the outlet gas flow path.

As shown in FIG. 1, the positioning of the through-tubes in each tray is slightly offset from the positions of the through-tubes in an adjacent tray, thereby forcing the carrier gas to circulate within the tray for contact of the carrier gas with the vaporized source material before the resulting gas mixture is transported through the through-tubes into the next-adjacent tray region. By such arrangement, the multiple levels of contacting of the carrier gas with the source reagent material permits the carrier gas to become saturated in a highly efficient manner.

The size of the vaporizer package 10 can be widely varied depending on the amount of the vapor to be supplied to the downstream fluid-utilizing installation, such as a CVD apparatus or ion implantation system. In one embodiment, the vaporizer has a cylindrical conformation with an inner diameter in a range of from about 3 to 6 inches, e.g., about 3.75 inches. The number of trays in the interior volume of the vaporizer container will be determined by the size of the vaporizer package. In various embodiments, from three to five trays are enclosed in the vaporizer container.

The vaporizer containing a multiplicity of trays can be heated and kept at a desired temperature appropriate to the specific source material to be vaporized, the desired concentration of the source reagent in the carrier gas mixture that is delivered to the downstream fluid-utilizing facility from the vaporizer, and the specific set of operating conditions that is employed in the source reagent vaporization operation.

Heating of the vaporizer container can be conducted in any suitable manner. In one embodiment, a ribbon heater is wound around the vaporizer. In another embodiment, a block heater having a shape covering at least a major portion of the external surface of the vaporizer is employed to heat the vaporizer container. In still another embodiment, a heat transfer fluid at elevated temperature may be contacted with the exterior surface of the vaporizer container, to effect heating thereof. A further embodiment involves heating by infrared or other radiant energy being impinged on the vaporizer container.

The disclosure in a further embodiment contemplates heating of the source reagent by circulation of a hot gas in the container, to effect convective heating of the solid source reagent.

The method of heating of the vaporizer container is not particularly limited as long as the vaporizer is brought thereby to a desired temperature level and maintained at such temperature level in an accurate and reliable manner.

It is desirable to heat the vaporizer container in a thermally homogeneous fashion, so that temperature deviations in the interior volume of the container are minimized. In specific embodiments, in which the trays are in direct thermal contact with the wall, heating of such trays via thermal conduction from the wall affords a convenient and effective way to vaporize the source reagent on the trays.

It may be desirable in some applications to utilize added surface area structures in the interior volume of the vaporizer container, to enhance the extent and rate of heating of the source reagent material for vaporization thereof.

As another expedient for achieving high efficiency vaporization of the source material, the carrier gas may be heated prior to its introduction to the interior volume of the vaporizer container, to assist the heating of the chemical reagent and vaporization thereof. For example, the flow line supplying the carrier gas to the inlet valve 20 may be heat-traced, or otherwise subjected to heating, to effect delivery of the carrier gas to the vaporizer container at a desired temperature level.

In a specific arrangement for vapor delivery from sublimable solid source chemical reagents, the vaporizer package utilizes a series of heated trays including a plurality of heated through-tubes that increase the heated surface area, thereby enabling sublimation of the solid source chemical reagent material to be achieved in a highly efficient manner as a result of the increased distribution of heat.

In the use of vaporizer packages in accordance with the present disclosure, the source reagent material can be introduced into the vaporizer container, contained in the trays or otherwise disposed in the interior volume of the vaporizer container, prior to securing the cover to the vessel (see FIG. 1, wherein the cover 18 is secured by bolt mechanical fasteners to the vessel). The source reagent material may be in any suitable form, including solid form, liquid form, semi-solid form, or a solution containing the source reagent material dissolved or dispersed in a suitable solvent medium.

In one embodiment, the source reagent material is provided in the form of a deposit, coated on the surfaces of the trays and through-tubes within the tray cavity as a film or coating of suitable thickness. Such film or coating may be formed by any of various suitable methods, including the method of melting the source reagent by heating same, applying the molten source reagent material to the surfaces of the trays and through-tubes and then cooling the applied material.

In another embodiment, wherein the source chemical reagent comprises a metal complex, the metal complex can be dissolved in a solvent and the resulting solution applied to the surfaces of the trays and through-tubes, followed by removal of the solvent from the applied material under reduced pressure.

The vaporizer package thus can include a plurality of vertically stacked trays mounted on a central downtube in the interior volume of the vaporizer container. The source chemical reagent material can be loaded into the interior volume of the vessel, by charging of the trays with predetermined amounts of the source chemical reagent, e.g., a metered amount of particulate solids. After such loading of the source reagent in the vaporizer vessel, the cover 18 of the package is positioned on the top of the vessel and sealed thereto, such as by an O-ring element fabricated of polytetrafluoroethylene or an elastomer, and by mechanical fasteners such as bolt fasteners.

After assembly of the vaporizer package, and coupling of the vaporizer package with process lines for delivery of carrier gas to the enclosed volume of the package container, and discharge from the vessel of carrier gas mixture containing the source chemical reagent vapor, the vaporizer heater is actuated to effect heating of the vaporizer container. The heating is conducted so that the internal temperature within the vaporizer and contacting trays is increased to a temperature sufficient to vaporize the source chemical reagent material.

Figure 2:
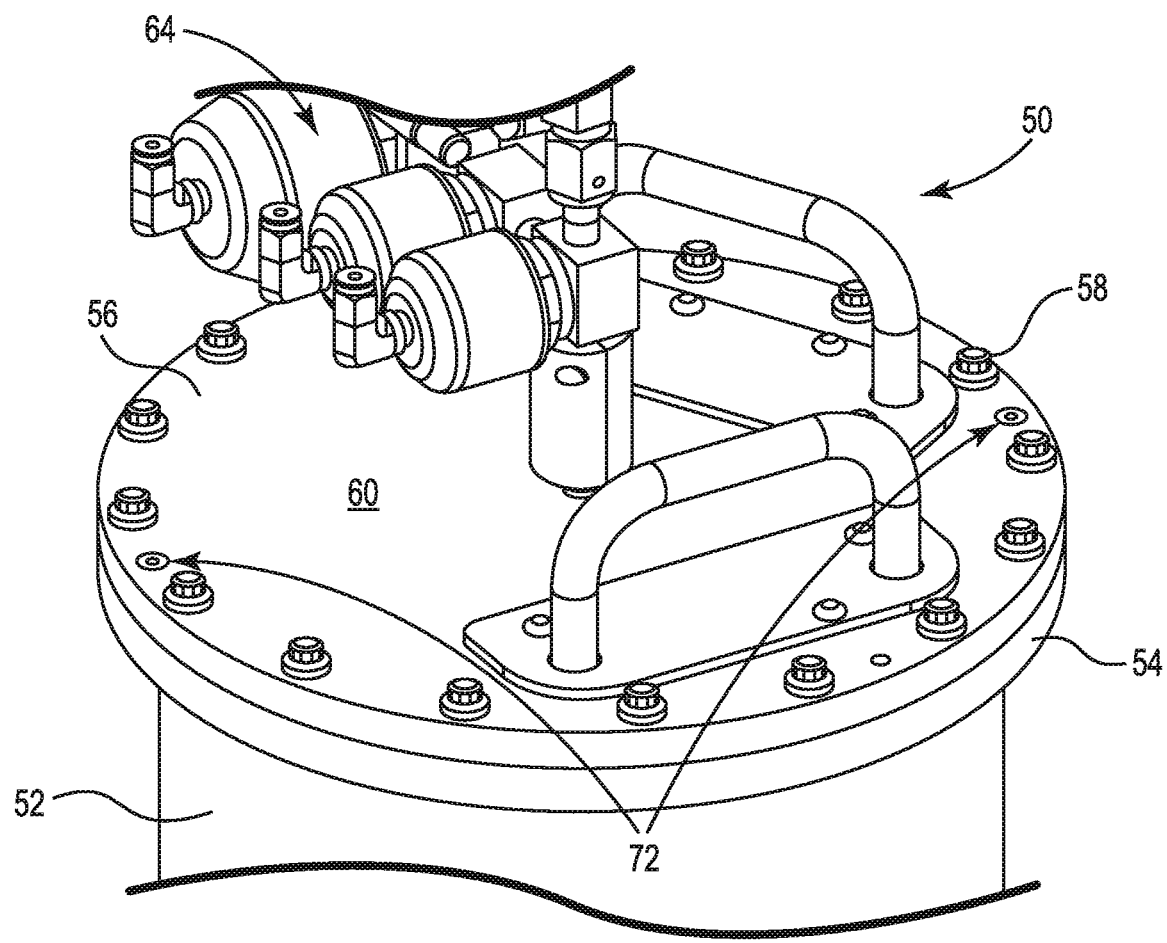
FIG. 2 is a perspective view of a chemical reagent package to which the tamper-resistant features of the present disclosure have been applied.

FIG. 2 is a perspective view of a chemical reagent package 50 to which tamper-resistant features of the present disclosure have been applied.

The chemical reagent package 50 as illustrated includes a container 52 having an outwardly and circumferentially extending flange 54 at its upper end. The flange matably engages with a cover 56 having a flat top surface 60 as shown. Coupled to the cover is a valve array 64, including an inlet valve associated with an inlet passage member, and an outlet valve associated with an outlet passage member of the package.

The cover 56 of the FIG. 2 package is interconnected with the flange 54 at the upper portion of the container 52 by an array of mechanical fasteners. The array of mechanical fasteners includes a first sub-array of the mechanical fasteners, comprising seal mechanical fasteners 58 that aggregately seal the engaged container and cover, and a second sub-array of the mechanical fasteners, comprising tamper-resistant mechanical fasteners 72 that interconnect the cover with the portion of the container engaging the cover, but which (i) aggregately in the absence of the first sub-array of the mechanical fasteners, do not seal the engaged container and cover, and (ii) by their tamper-resistant character prevent the cover from being disengaged from the container except by tampering removal thereof from the engaged container and cover.

Figure 3:
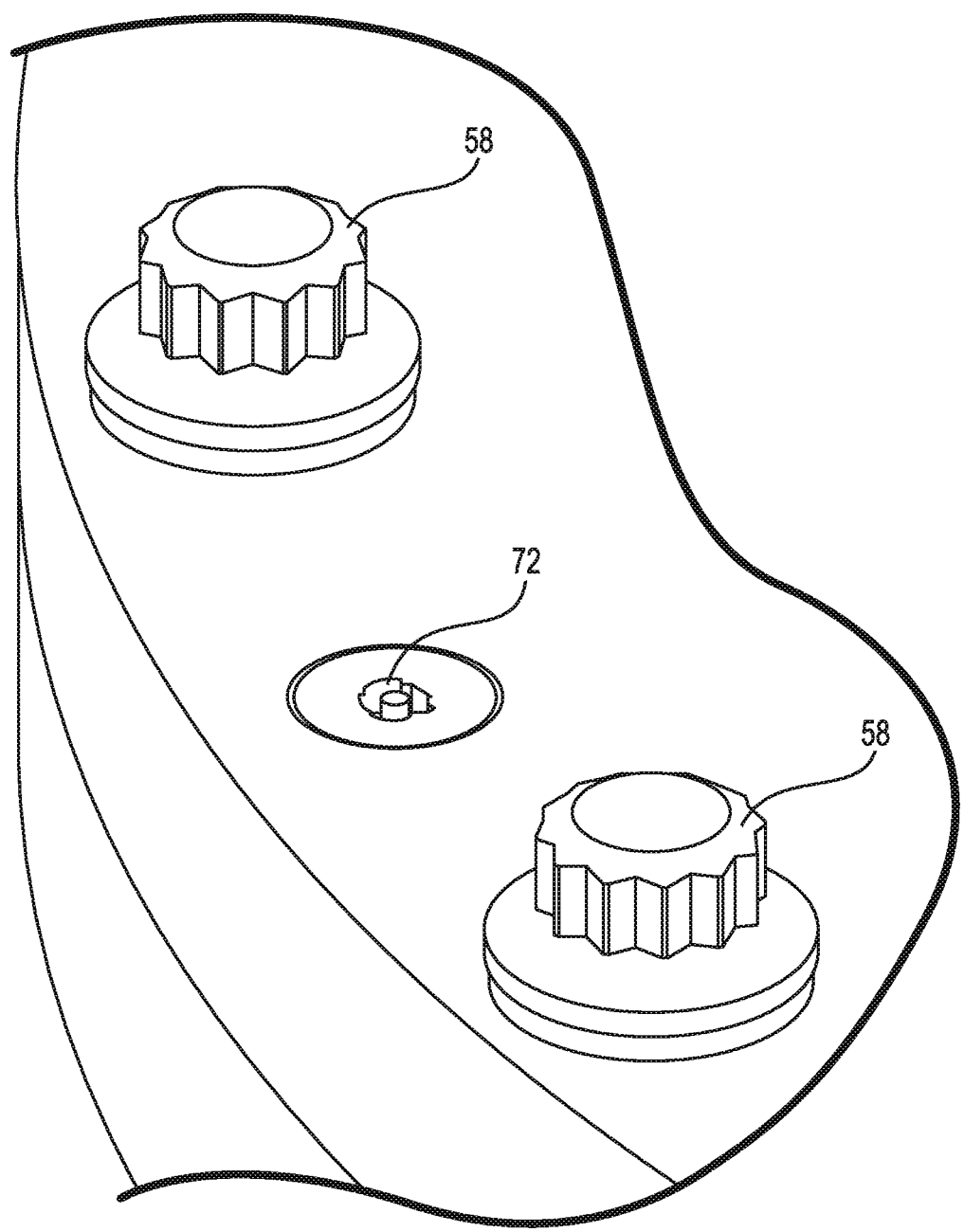
FIG. 3 is an enlarged perspective view of a portion of the FIG. 2 chemical reagent package, showing the details of the seal mechanical fasteners in a first sub-array of the mechanical fasteners, and the tamper-resistant mechanical fasteners of the second sub-array of the mechanical fasteners.

FIG. 3 is an enlarged perspective view of a portion of the FIG. 2 chemical reagent package, showing the details of the seal mechanical fasteners 58 in a first sub-array of the mechanical fasteners, and the tamper-resistant mechanical fasteners 72 of the second sub-array of the mechanical fasteners.

Thus, the package of FIGS. 2-3 includes tamper-resistant bolts as a non-sealing feature of the package, whose only purpose is to prevent a user of the package from fully removing the cover from the container. The tamper-resistant bolts are specialty bolts that can only be non-tamperingly removed by means of a special key. Such special key may be provided with the package to a purchaser of the package at the time of sale, to be used only in circumstances not entailing a risk of injury or damage by reason of exposure to the package contents. As shown in FIG. 3, the tamper-resistant bolts may be of a flat head character that is slightly sunk below the surface of the package cover, to prevent tools such as pliers or vise grips from being used to remove such tamper-resistant bolts.

Figure 4:
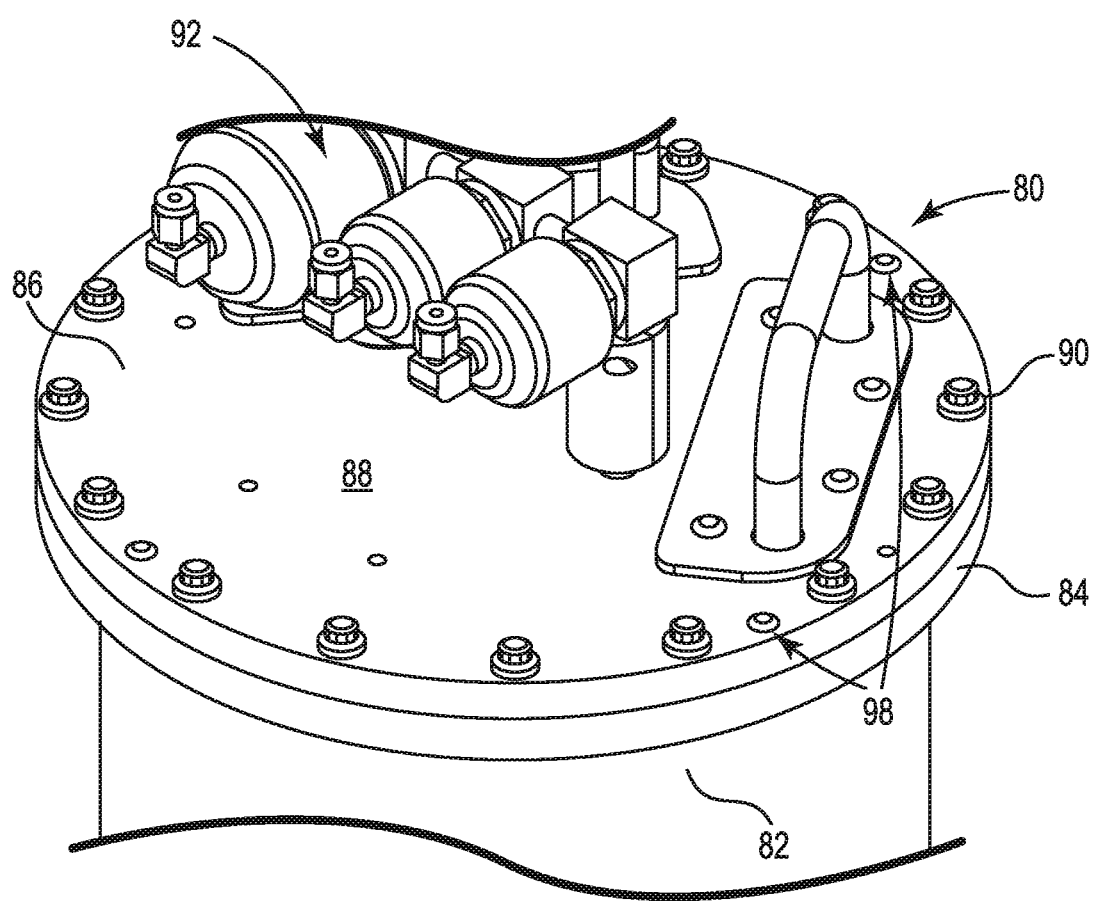
FIG. 4 is a perspective view of a chemical reagent package to which tamper-resistant features of the present disclosure have been applied, according to another embodiment of the disclosure.

FIG. 4 is a perspective view of a chemical reagent package 80 to which tamper-resistant features of the present disclosure have been applied, according to another embodiment of the disclosure.

The chemical reagent package 80 as illustrated includes a container 82 having an outwardly and circumferentially extending flange 84 at its upper end. The flange matably engages with a cover 86 having a flat top surface 88 as shown. Coupled to the cover is a valve array 92, including an inlet valve associated with an inlet passage member, and an outlet valve associated with an outlet passage member of the package.

The cover 86 of the FIG. 4 package is interconnected with the flange 84 at the upper portion of the container 82 by an array of mechanical fasteners. The array of mechanical fasteners includes a first sub-array of the mechanical fasteners, comprising seal mechanical fasteners 90 that aggregately seal the engaged container and cover, and a second sub-array of the mechanical fasteners, comprising tamper-resistant mechanical fasteners 98 that interconnect the cover with the portion of the container engaging the cover, but which (i) aggregately in the absence of the first sub-array of the mechanical fasteners, do not seal the engaged container and cover, and (ii) by their tamper-resistant character prevent the cover from being disengaged from the container except by tampering removal thereof from the engaged container and cover. Although only three tamper-resistant fasteners 98 are visible in the perspective view of FIG. 4, it will be understood that a fourth tamper-resistant fastener is located behind the valve cluster 92 disposed on the cover 86 of the package. It will further be understood that the number of tamper-resistant mechanical fasteners may be varied depending on the structure and requirements of a specific package, and that any suitable number may be employed in a specific package application, including packages in which the second sub-array of the mechanical fasteners includes 2, 3, 4, 5, 6, or more tamper-resistant mechanical fasteners.

Figure 5:
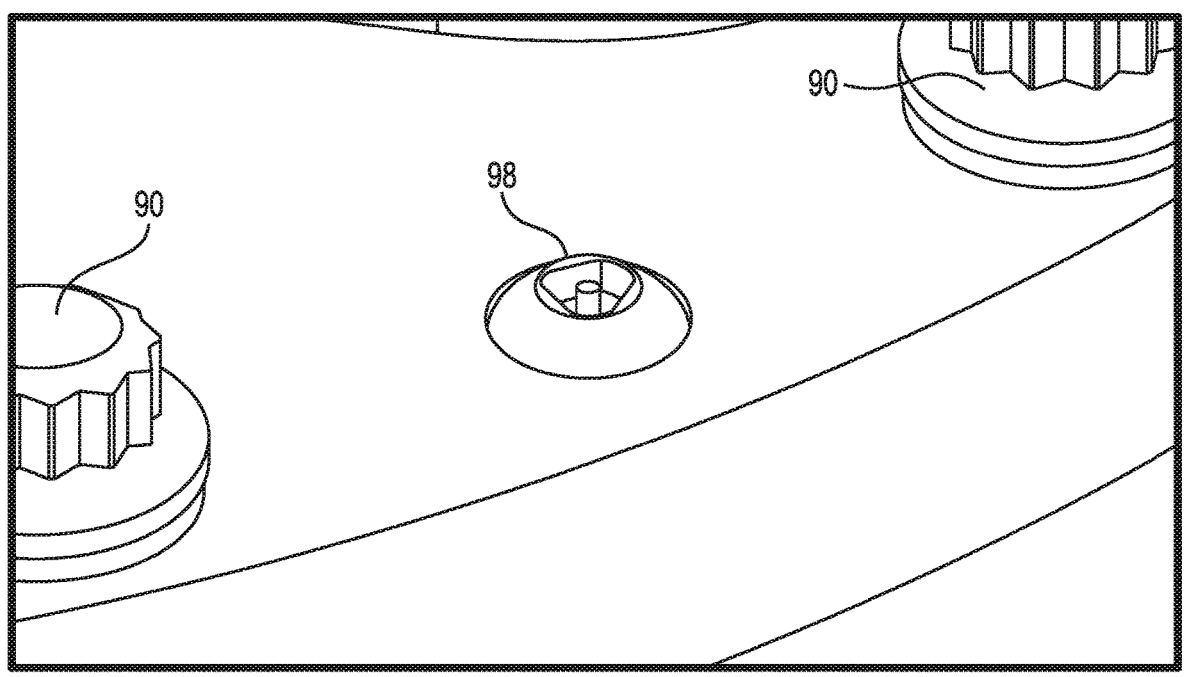
FIG. 5 is an enlarged perspective view of a portion of the FIG. 2 chemical reagent package, showing the details of the seal mechanical fasteners in a first sub-array of the mechanical fasteners, and the tamper-resistant mechanical fasteners of the second sub-array of the mechanical fasteners.

FIG. 5 is an enlarged perspective view of a portion of the FIG. 2 chemical reagent package, showing the details of the seal mechanical fasteners 90 in a first sub-array of the mechanical fasteners, and the tamper-resistant mechanical fastener 98 and of the second sub-array of the mechanical fasteners.

Figure 6:
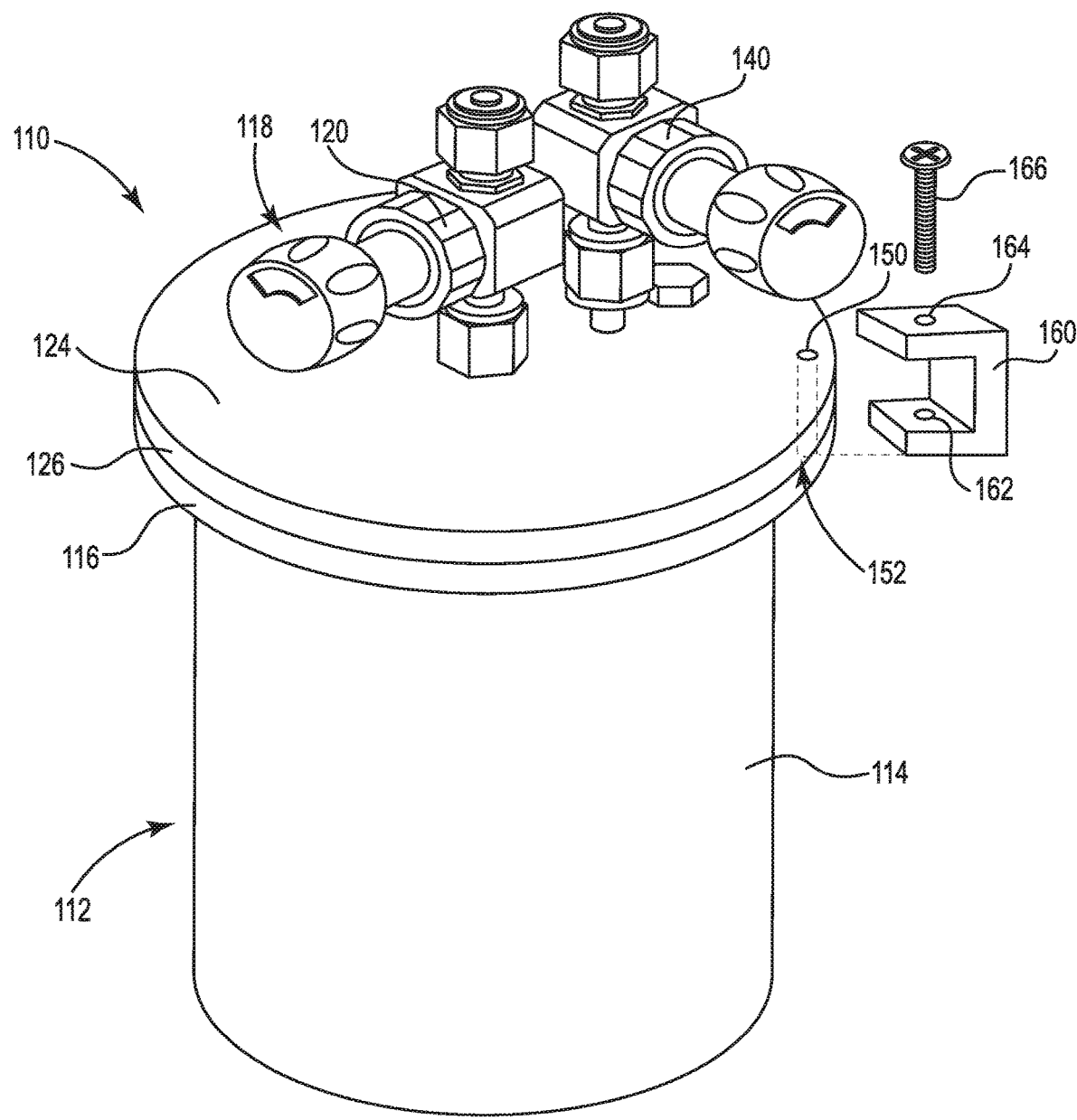
FIG. 6 is a perspective view of a chemical reagent package, according to another embodiment of the disclosure, including a tamper-resistant sealing member.

FIG. 6 is a perspective view of a chemical reagent package 110, according to another embodiment of the disclosure, including a tamper-resistant sealing member.

The tamper-resistant package 110 includes a container 112 having a circumscribing cylindrical wall 114 and a floor (not visible in FIG. 6) defining an enclosed interior volume for holding chemical reagent whose exposure to an ambient environment of the container would result in health and/or safety issues, and/or detriment to the chemical reagent, e.g., air-mediated decomposition of the chemical reagent.

The container 112 includes an upper, radially outwardly extending flange 116 that is matably engaged by an outer peripheral portion 126 of the cover 124 of the package.

Mounted on the cover 124 is an inlet/outlet assembly 118, including an inlet subassembly 120, and an outlet subassembly 140, by which carrier gas may be introduced into the interior volume of the container, for contact with vapor of the chemical reagent therein. Such chemical reagent may be a solid chemical reagent that is volatilized by heating of the container 112 (heating components not shown in FIG. 6). The contacting of the carrier gas with the vapor of the chemical reagent produces a carrier gas/chemical reagent vapor mixture, which is discharged from the container by flow through the outlet subassembly 140. For such purpose, the outlet subassembly 140 may be coupled to appropriate flow circuitry, to transport the carrier gas/chemical reagent vapor mixture to a downstream process in which the chemical reagent vapor is utilized.

FIG. 6 includes an illustrative tamper-resistant feature, including a sealing bracket 160, which as shown is of a form including two parallel flange sections joined by an intermediate yoke section, so that the sealing bracket is generally of C-shape. The sealing bracket is formed with an upper flange having a threaded hole 164 therein, and a lower flange having a threaded hole 162 therein. In this embodiment, the outer peripheral portion 126 of the cover 124 of the package and the upper, radially outwardly extending flange 116 are provided with a threaded passage 152 therethrough, which terminates at a top surface of the cover 124 at opening 150. The sealing bracket 160 thus may placed over the outer peripheral portion 126 and upper, radially outwardly extending flange 116, so that threaded hole 162 and threaded hole 164 are brought into registration with threaded passage 152, with the threaded hole 164 overlying opening 150. A threaded mechanical fastener 166 then may be threadably engaged with the threaded hole 164, opening 150, passage 152, and threaded hole 162, so that the resulting assembly exerts compressive engagement of the outer peripheral portion 126 of the cover with the upper, radially outwardly extending flange 116 of the container, to effect sealing therebetween. To assist in the sealing action of such compressive engagement, a gasket, sealing ring, or the like can be deployed between the outer peripheral portion 126 of the cover and the upper, radially outwardly extending flange 116 of the container.

The threaded mechanical fastener 166 for such purpose is provided with a tamper-resistant head requiring a special tool for rotative driving of the threaded mechanical fastener through the threaded hole 164, opening 150, passage 152, and threaded hole 162. Although the FIG. 6 embodiment is shown as employing only a single tamper-resistant feature, i.e., the threadably engageable C-shaped clamp assembly, it will be appreciated that in other embodiments, a multiplicity of such clamp assemblies may be provided along the periphery of the flange and cover components, so that the container and cover are fully circumferentially secured with the tamper-resistant clamp assembly.

It will also be appreciated that in lieu of threaded engagement with a passage 152 through the cover and container flange as illustrated, the sealing bracket may be constructed so that it engages the cover and container flange at a peripheral region thereof, with the threaded openings 162 and 164 in the respective flanges of the sealing bracket being radially displaced from the edge of the flange 116 and outer peripheral portion 126 of the cover, so that the threaded mechanical fastener 166 itself does not contact the flange 116 or outer peripheral portion 126 of the cover.

It will further be appreciated that in lieu of the sealing bracket 160 being a single-piece member that is force-fitted over the mated flange 116 and outer peripheral portion 126 of the cover, the sealing bracket may be formed in respective upper and lower portions that are vertically slidably engageable with one another, so that the threaded mechanical fastener is effective in drawing the vertically slidably engaged upper and lower portions of the sealing bracket towards one another to thereby exert increasing compressive action on the cover and container flange, to effect sealing action, concurrently with forming a tamper-resistant feature. Such two-piece sealing bracket may be used with mechanical fasteners that engage with openings in the peripheral portion of the flange and cover, or alternatively the two-piece sealing bracket may be arranged so that the threaded mechanical fastener is radially displaced outwardly from the vertical outer edge surfaces of the cover and container flange.

It will also be appreciated that other forms of sealing assemblies may be employed, which in addition to a sealing function concurrently impart tamper-resistance to the chemical reagent package with which they are deployed.

Finally, it will be appreciated from the foregoing that the tamper-resistant features of the present disclosure may be effectively utilized to protect the contents of a package, e.g., a chemical reagent package, from inadvertent or accidental opening that may expose the contents to an exterior environment of the package, and in the case of toxic or otherwise hazardous chemical reagents that may involve risk of injury or death, or damage to the ambient environment of the package.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A tamper-resistant containment package, comprising:
   a container having an outwardly extending flange having an engagement surface;
   a cover engaged at a peripheral portion with the engagement surface of the flange of the container so that the container and cover form an enclosed volume;
   an array of mechanical fasteners interconnecting the cover with the outwardly extending flange of the container engaging the peripheral portion of the cover, said array comprising:
   a first sub-array of said mechanical fasteners, comprising seal mechanical fasteners that aggregately seal the engaged container flange and cover; and
   a second sub-array of said mechanical fasteners, comprising tamper-resistant mechanical fasteners that interconnect the peripheral portion of the cover with the outwardly extending flange of the container engaging the cover, but which (i) aggregately in the absence of the first sub-array of said mechanical fasteners, do not seal the engaged container and cover, and (ii) by their tamper-resistant character prevent the cover from being disengaged from the container except by tampering removal thereof from the engaged container and cover.

2. The tamper-resistant containment package of claim 1, wherein the second sub-array of said mechanical fasteners comprises tamper-resistant mechanical fasteners that are at least one of: (i) smaller in size than the seal mechanical fasteners of the first sub-array of said mechanical fasteners; (ii) non-removable by mechanical fastener tools adapted for removal of the seal mechanical fasteners; (iii) countersunk in the cover below a surface above which the seal mechanical fasteners of the first sub-array of said mechanical fasteners protrude; and (iv) characterized by a lock torque that is from 10 to 60% of lock torque of the seal mechanical fasteners of the first sub-array of said mechanical fasteners.

3. The tamper-resistant containment package of claim 2, comprising at least two of features (i)-(iv).

4. The tamper-resistant containment package of claim 1, further comprising at least one seal element intermediate the engaged container and cover.

5. The tamper-resistant containment package of claim 4, wherein the at least one seal element comprises a gasket.

6. The tamper-resistant containment package of claim 1, wherein the container is configured to be heated to transmit thermal energy to solid material in the enclosed volume.

7. The tamper-resistant containment package of claim 6, in combination with a heater adapted to transmit the thermal energy to the solid material in the enclosed volume.

8. The tamper-resistant containment package of claim 6, wherein the at least one support structure comprises at least one tray in the enclosed volume.

9. The tamper-resistant containment package of claim 1, wherein the second sub-array of said mechanical fasteners comprises tamper-resistant mechanical fasteners that are non-removable by mechanical fastener tools adapted for removal of the seal mechanical fasteners.

10. The tamper-resistant containment package of claim 1, wherein the second sub-array of said mechanical fasteners comprises tamper-resistant mechanical fasteners that are characterized by a lock torque that is from 10 to 60% of lock torque of the seal mechanical fasteners of the first sub-array of said mechanical fasteners.

11. The tamper-resistant containment package of claim 1, wherein at least one of the tamper-resistant mechanical fasteners engages a sealing bracket so that the sealing bracket exerts compression on the flange of the container and the cover for sealing of the container and cover in a sealed state isolating the enclosed volume from an ambient environment.

12. The tamper-resistant containment package of claim 11, wherein the at least one tamper-resistant mechanical fastener is effective to maintain the container and cover in the sealed state.

13. The tamper-resistant containment package of claim 11, wherein the at least one tamper-resistant mechanical fastener threadably engages the cover and container.

14. A tamper-resistant package, comprising:
a chemical reagent container having an outwardly extending flange having an engagement surface;
a cover engaged at a peripheral portion with the engagement surface of the flange of the chemical reagent container so that the container and cover form an enclosed volume;
at least one seal element intermediate the engaged container and cover;
an array of mechanical fasteners interconnecting the cover with the outwardly extending flange portion of the container engaging the peripheral portion of the cover, said array comprising:
a first sub-array of said mechanical fasteners, comprising seal mechanical fasteners that aggregately with the at least one seal element leak-tightly seal the engaged container flange and cover; and
a second sub-array of said mechanical fasteners, comprising tamper-resistant mechanical fasteners that interconnect the peripheral portion of the cover with the outwardly extending flange of the container engaging the cover, but which (i) aggregately in the absence of the first sub-array of said mechanical fasteners, do not leak-tightly seal the engaged container and cover, and (ii) by their tamper-resistant character prevent the cover from being disengaged from the container except by tampering removal thereof from the engaged container and cover.

15. The tamper-resistant package of claim 14, wherein the tamper-resistant mechanical fasteners have a lock torque that is from 10% to 60% of lock torque of the seal mechanical fasteners.

* * * * *